United States Patent
Xie et al.

(10) Patent No.: US 12,305,894 B1
(45) Date of Patent: May 20, 2025

(54) MULTI-PARAMETER INTEGRATED TEST SYSTEM FOR DEEP GEOTHERMAL IN-SITU POWER GENERATION

(71) Applicant: Shenzhen University, Shenzhen (CN)

(72) Inventors: Heping Xie, Shenzhen (CN); Jun Wang, Shenzhen (CN); Jiaxi Liao, Shenzhen (CN); Xiting Long, Shenzhen (CN); Licheng Sun, Shenzhen (CN); Zhichao Liu, Shenzhen (CN); Juchang Ma, Shenzhen (CN); Tianyi Gao, Shenzhen (CN); Entong Xia, Shenzhen (CN); Biao Li, Shenzhen (CN)

(73) Assignee: Shenzhen University, Shenzhen (CN)

( * ) Notice: Subject to any disclaimer, the term of this patent is extended or adjusted under 35 U.S.C. 154(b) by 0 days.

(21) Appl. No.: 19/014,594

(22) Filed: Jan. 9, 2025

(30) Foreign Application Priority Data

May 16, 2024 (CN) .......................... 202410605354.2

(51) Int. Cl.
*F24T 50/00* (2018.01)
*G01D 21/02* (2006.01)
*H10N 10/00* (2023.01)

(52) U.S. Cl.
CPC .............. *F24T 50/00* (2018.05); *G01D 21/02* (2013.01); *H10N 10/00* (2023.02); *Y02E 10/10* (2013.01)

(58) Field of Classification Search
CPC ......... F24T 50/00; G01D 21/02; H10N 10/00; Y02E 10/10
See application file for complete search history.

(56) References Cited

U.S. PATENT DOCUMENTS

| 12,055,523 B1* | 8/2024 | Li .............................. G01N 3/08 |
| 2011/0125451 A1 | 5/2011 | Cheifetz et al. |
| 2011/0238362 A1* | 9/2011 | Kidwell .................. F24T 10/17 |
| | | 702/182 |
| 2012/0079880 A1* | 4/2012 | Freitag .................. G01M 10/00 |
| | | 73/198 |
| 2013/0014576 A1* | 1/2013 | Pelletier .................... F04B 3/00 |
| | | 73/152.24 |
| 2025/0034992 A1* | 1/2025 | Steele ..................... E21B 47/10 |

FOREIGN PATENT DOCUMENTS

| KR | 20110079449 A | 7/2011 |
| KR | 20130009265 A | 1/2013 |

OTHER PUBLICATIONS

Retrieval report dated Jun. 27, 2024 in SIPO application No. 202410605354.2.
Notification to Grant Patent Right for Invention dated Jul. 1, 2024 in SIPO application No. 202410605354.2.

* cited by examiner

*Primary Examiner* — Hoang M Nguyen
(74) *Attorney, Agent, or Firm* — Piloff Passino & Cosenza LLP; Rachel K. Pilloff; Sean A. Passino

(57) ABSTRACT

A multi-parameter integrated test system for deep geothermal in-situ power generation is provided, including an evaporation interval, an insulation interval and a condensation interval respectively defined on a tube body, where a thermoelectric module arranged on the evaporation interval and configured to generate output electric energy; the working medium generates liquid-gas-liquid phase change movement along the direction from the evaporation interval to the condensation interval to drive an internal generator to generate electricity; and the system is equipped with a variety of parameter measuring sensors.

7 Claims, 3 Drawing Sheets

MULTI-PARAMETER INTEGRATED TEST SYSTEM FOR DEEP GEOTHERMAL IN-SITU POWER GENERATION

CROSS-REFERENCE TO RELATED APPLICATIONS

This application claims priority to Chinese Patent Application No. 202410605354.2, filed on May 16, 2024, the contents of which are hereby incorporated by reference.

TECHNICAL FIELD

The disclosure belongs to the technical field of thermal power generation, and in particular to a multi-parameter integrated test system for deep geothermal in-situ power generation.

BACKGROUND

With the promotion of energy conservation and carbon reduction in China, more and more attention has been paid to the development and utilization of various new energy sources. Geothermal energy, as one of the new energy sources, has become one of the research hotspots at present, especially the utilization of geothermal energy to generate electricity, which is an important direction of geothermal energy development and utilization. At present, one of the geothermal power generation methods is to use organic working medium Rankine cycle system to generate electricity. The system uses low boiling point organic matter as working medium, which obtains heat from geothermal fluid in the flow system to generate organic matter steam, drive the turbine to rotate and drive the generator to generate electricity. With the development of thermoelectric materials (materials that may realize the interactive conversion of electric energy and thermal energy, also called thermoelectric materials), thermoelectric devices may be used to directly convert geothermal energy into electric energy, in addition to using Rankine cycle system as an organic working medium for geothermal power generation. The working procedures of these two geothermal power generation modes do not interfere with each other, so it is possible to work together in the same power generation system. Although some scholars have put forward the idea of combining these two methods to improve power generation efficiency, there is no mature research on the related practical testing technology and device constructed by this idea.

In traditional experimental testing, the monitoring and recording of experimental data usually need manual operation, which has certain errors and may not realize real-time monitoring. However, the related parameters (such as temperature, pressure, flow rate, liquid level, current, voltage, etc.) involved in the process of geothermal power generation are huge and need to be monitored in real time, so it is difficult to meet the needs by using traditional data monitoring methods, and it is very important for geothermal power generation testing to realize real-time monitoring of experimental parameters at the same time.

Therefore, there is an urgent need for a multi-parameter integrated test system for deep geothermal in-situ power generation, which may provide reference for the improvement and optimization of deep geothermal in-situ power generation technology and devices, and explore ways to improve the efficiency of geothermal power generation.

SUMMARY

The objective of the disclosure is to provide a multi-parameter integrated test system for deep geothermal in-situ power generation, so as to solve the above problems, realize the monitoring of various parameters on the test system, meet the requirements of centralized display, control and automatic collection and recording of data, and facilitate the exploration of the performance of geothermal in-situ power generation under different working conditions.

In order to achieve the above objectives, the disclosure provides the following scheme. A multi-parameter integrated test system for deep geothermal in-situ power generation, including:

a tube body, an inner cavity is movably matched with working medium, and an evaporation interval, a thermal insulation interval and a condensation interval are respectively defined on the tube body, where under an action of heat conduction, the working medium moves along a direction from the evaporation interval to the condensation interval, and a form of the working medium is switched in an order of liquid-gas-liquid; the evaporation interval and the thermal insulation interval output electric energy outwards, and the working medium always moves towards the evaporation interval in a liquid state;

a testing mechanism, including:

a first measuring part arranged in the tube body to obtain parameter signals of the working medium in a testing process;

a second measuring part arranged in the evaporation interval, the thermal insulation interval and the condensation interval to obtain parameter signals of the inner cavity of the tube body in each interval part;

a temperature measuring part arranged on a surface of the tube body to obtain temperature signals of the tube body in the testing process;

a liquid level gauge communicated with a part of the tube body located in the evaporation interval to obtain liquid level signals of the working medium in the evaporation interval;

a data collection part respectively in communication connection with the first measuring part, the second measuring part, the temperature measuring part and the liquid level gauge, so as to respectively collect the parameter signals of the working medium, the parameter signals of the inner cavity of the tube body in the each interval part, the temperature signals of the tube body and the liquid level signals of the working medium in the evaporation interval;

Optionally, the system further includes:

an electric energy measuring part, arranged in the thermal insulation interval and the evaporation interval and used for obtaining output electric energy parameters and is in communication connection with the data collection part; and a working medium conveying part, connected with the tube body and is in communication connection with the data collection part; when the liquid level signals of the working medium in the evaporation interval collected by the data collection part is lower than a standard value, the working medium conveying part is used for supplementing the working medium into the tube body;

Optionally, the first measuring part includes:

at least one fiber grating sensor arranged in the tube body along a length direction of the tube body and used for obtaining temperature signals and pressure signals of the working medium in the testing process, and one end of the fiber grating sensor is in communication connection with the data collection part through a fiber demodulator;

Optionally, the second measuring part includes:

at least two flow velocity sensors respectively arranged at joints of the thermal insulation interval, the evaporation interval and the condensation interval and used for obtaining flow velocity signals of the inner cavity of the tube body in the each interval part; and at least two pressure transmitters, respectively arranged at the joints of the thermal insulation interval, the evaporation interval and the condensation interval, and are used for obtaining the pressure signals of the inner cavity of the tube body in the each interval part;

where, the flow velocity sensors and the pressure transmitters are respectively in communication connection with the data collection part.

Optionally, the temperature measuring part includes:

a plurality of surface thermocouples uniformly distributed on the surface of the tube body along the length direction of the tube body for obtaining temperature signals of the surface of the tube body, and the plurality of the surface thermocouples are in communication connection with the data collection part through a multi-channel PID temperature controller.

Optionally, the system further includes:

a thermoelectric module arranged on the evaporation interval and configured to generate output electric energy when the action of the heat conduction is existed outside; and a plurality of generators arranged on the thermal insulation interval, where the generators are provided with a power generation end, and when the working medium passes through the thermal insulation interval in a gas state, the power generation end moves to generate the output electric energy, where the thermoelectric module and the generators are in communication connection with the data collection part.

Optionally, the system further includes:

a heat source, where a heating end of the heat source is connected with the evaporation interval, so that the working medium is always switched from the liquid state to the gas state, where the working medium in the gas state moves along the direction from the evaporation interval to the condensation interval; and a refrigerant arranged in the condensation interval and configured to absorb heat of the working medium in the gas state, so as to enable the working medium switching from the gas state to the liquid state.

Optionally, the heat source includes:

a plurality of electric heating plates coated on an outer wall surface of the evaporation interval, and one end of each of the electric heating plates is connected with a controller, and the electric heating plates have an adjustable heating temperature through the controller.

Optionally, the refrigerant includes:

a water-cooled condenser, where an outer wall of the condensation interval is coated with a plurality of heat exchange fins, and one end of the water-cooled condenser is connected with the heat exchange fins through a pipeline to absorb the heat of the working medium in the gas state; and an armored thermocouple arranged on a pipeline of the water-cooled condenser, and is in communication connection with the data collection part.

Optionally, a cross section of the tube body corresponding to the evaporation interval is a polygonized structure.

Compared with the prior art, the disclosure has the following advantages and technical effects.

According to the test system, the tube body is tested, and the parameter signals of the working medium in the testing process, the parameter signals of the inner cavity of the tube body in the testing process, the temperature signals of the tube body in the testing process and the liquid level signals of the working medium in the evaporation interval are monitored through the first measuring part, the second measuring part, the temperature measuring part and the liquid level gauge respectively, and the monitored parameter information is directly communicated with the data collection part, so that the real-time monitoring of experimental parameters and the inquiry acquisition of multiple parameters are realized, which is convenient for the subsequent thermal power generation technology.

BRIEF DESCRIPTION OF THE DRAWINGS

In order to explain the embodiments of the present disclosure or the technical scheme in the prior art more clearly, the drawings needed in the embodiments will be briefly introduced below. Obviously, the drawings in the following description are only some embodiments of the present disclosure. For ordinary people in the field, other drawings may be obtained according to these drawings without paying creative labor.

DETAILED DESCRIPTION OF THE EMBODIMENTS

In the following, the technical scheme in the embodiment of the disclosure will be clearly and completely described with reference to the attached drawings. Obviously, the described embodiment is only a part of the embodiment of the disclosure, but not the whole embodiment. Based on the embodiments in the present disclosure, all other embodiments obtained by ordinary technicians in the field without creative labor belong to the scope of protection of the present disclosure.

In order to make the above objectives, features and advantages of the present disclosure more obvious and easier to understand, the present disclosure will be further described in detail with the attached drawings and specific implementation methods.

Figure 1:
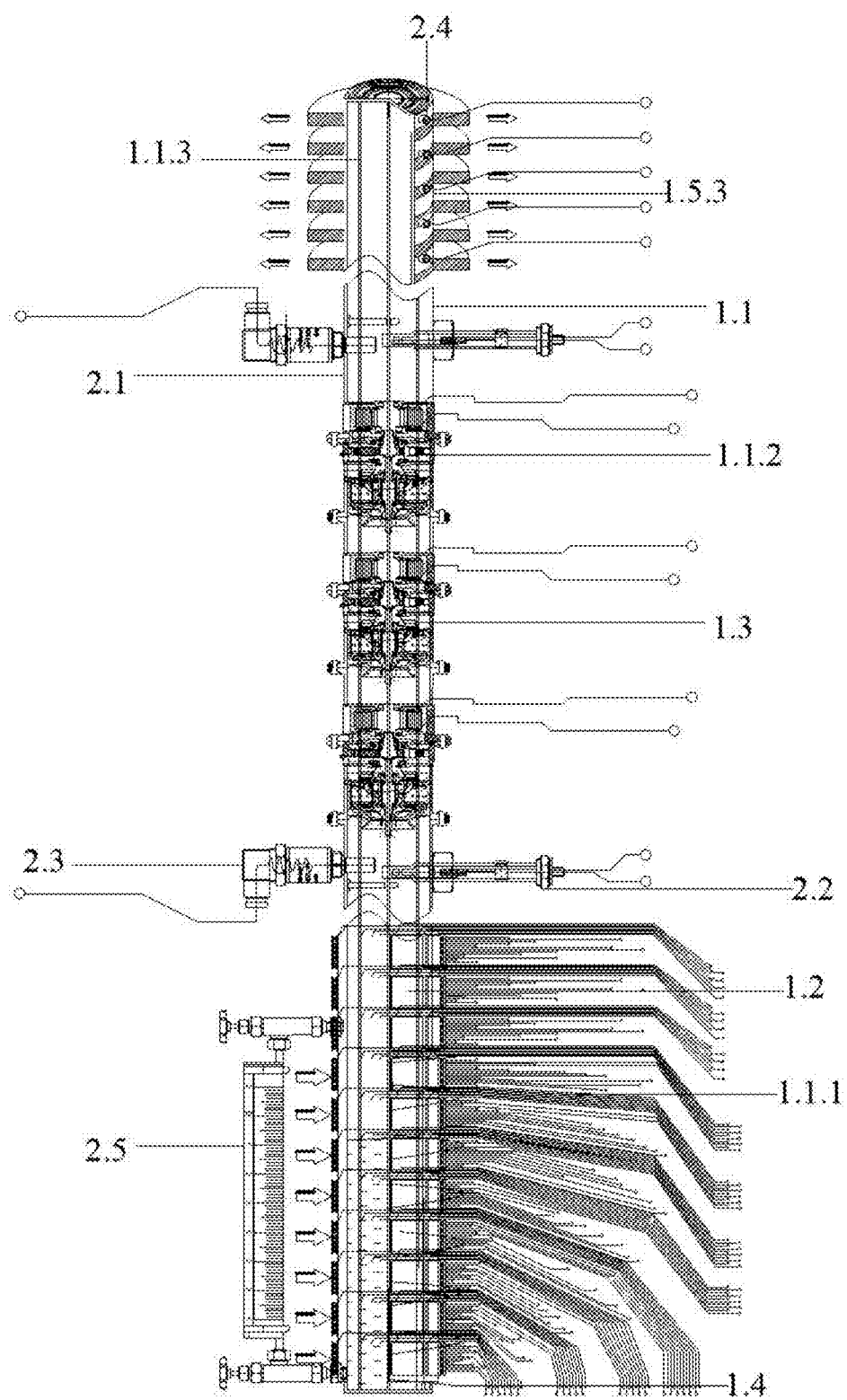
FIG. 1 is a diagram showing the connection relationship between a tube body and a liquid level gauge.
Figure 2:
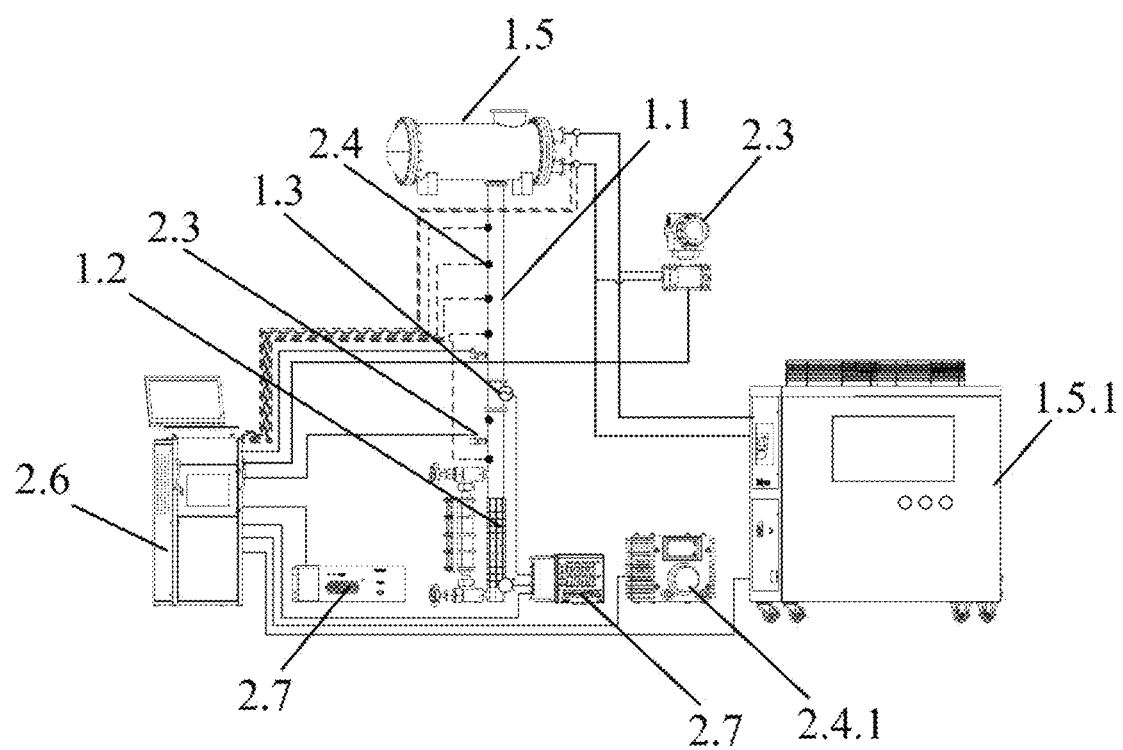
FIG. 2 is a diagram showing the connection relationship between the data collection part and the electric energy measuring part.
Figure 3:
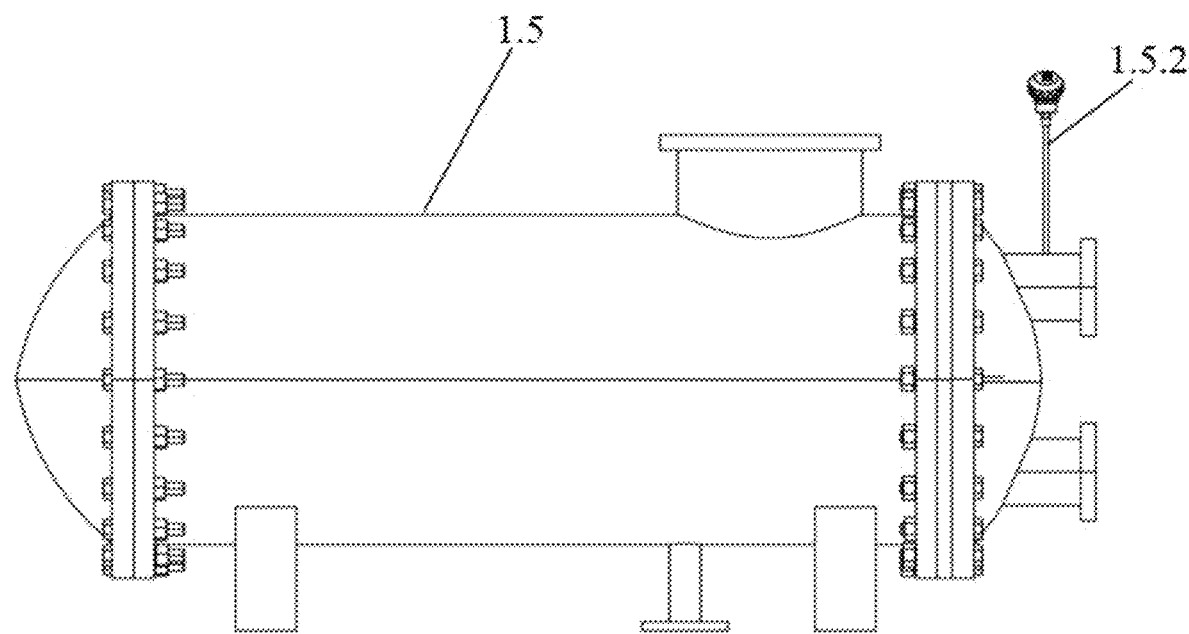
FIG. 3 is the diagram showing the connection relationship between the refrigerant and armored thermocouple.

EMBODIMENT as shown in FIG. 1-FIG. 3, a multi-parameter integrated test system for deep geothermal in-situ power generation, including:

a tube body 1.1, an inner cavity is movably matched with working medium, and an evaporation interval 1.1.1, a thermal insulation interval 1.1.2 and a condensation interval 1.1.3 are respectively defined on the tube body 1.1, where under an action of heat conduction, the working medium moves along a direction from the evaporation interval 1.1.1 to the condensation interval 1.1.3, and a form of the working medium is switched in an order of liquid-gas-liquid; the evaporation interval 1.1.1 and the thermal insulation interval 1.1.2 output electric energy outwards, and the working medium always moves towards the evaporation interval 1.1.1 in a liquid state;

The working medium is filled in the tube body 1.1, and heat conduction is generated to the evaporation interval 1.1.1 on the tube body 1.1, so that the working medium switches from liquid state to gas state and moves along the condensation interval 1.1.3, and then reaches the condensation interval 1.1.3 after passing through the thermal insulation interval 1.1.2, and then changes from gas state to liquid state, so as to move towards the evaporation interval 1.1.1 again, realizing the cyclic power generation of the working medium. In the process of power generation, under the condition of heat conduction and working medium movement, the evaporation interval 1.1.1 and the thermal insulation interval 1.1.2 output electric energy to realize in-situ thermal power generation.

The testing mechanism includes:
- a first measuring part arranged in the tube body 1.1 to obtain parameter signals of the working medium in a testing process;
- a second measuring part arranged in the evaporation interval 1.1.1, the thermal insulation interval 1.1.2 and the condensation interval 1.1.3 to obtain parameter signals of the inner cavity of the tube body 1.1 in each interval part;
- a temperature measuring part arranged on a surface of the tube body 1.1 to obtain temperature signals of the tube body 1.1 in the testing process;
- a liquid level gauge 2.5 communicated with a part of the tube body 1.1 located in the evaporation interval 1.1.1 to obtain liquid level signals of the working medium in the evaporation interval 1.1.1; and
- a data collection part 2.6 respectively in communication connection with the first measuring part, the second measuring part, the temperature measuring part and the liquid level gauge 2.5, so as to respectively collect the parameter signals of the working medium, the parameter signals of the inner cavity of the tube body 1.1 in the each interval part, the temperature signals of the tube body 1.1 and the liquid level signals of the working medium in the evaporation interval 1.1.1.

By testing the tube body 1.1, the parameter signals of the working medium, the parameter signals of the inner cavity of the tube body 1.1 in each interval part in the testing process, the temperature signals of the tube body 1.1 in the testing process and the liquid level signals of the working medium in the evaporation interval 1.1.1 are monitored by the first measuring part, the second measuring part, the temperature measuring part and the liquid level gauge 2.5 respectively. Meanwhile, the monitored parameter information is directly communicated with the data collection part 2.6, so as to realize real-time monitoring of experimental parameters and inquiry collection of multi-parameters, which is convenient to provide reference value for the improvement of subsequent thermal power generation technology and realize the improvement of geothermal power generation efficiency.

In this technical scheme, in order to monitor the liquid level signals of the working medium in the evaporation interval 1.1.1, the liquid level gauge 2.5 is respectively connected with the bottom of the tube body 1.1 and the joints of the evaporation interval 1.1.1 and the thermal insulation interval 1.1.2 through communicating pipes, so as to ensure that the liquid level measurement covers the whole evaporation interval 1.1.1, and the data collection part 2.6 preferably but not exclusively uses a computer to collect multiparameter signals.

Further, the system further includes:
- an electric energy measuring part 2.7, arranged in the thermal insulation interval 1.1.2 and the evaporation interval 1.1.1 and used for obtaining output electric energy parameters and is in communication connection with the data collection part 2.6; and
- a working medium conveying part, connected with the tube body 1.1 and is in communication connection with the data collection part 2.6; when the liquid level signals of the working medium in the evaporation interval 1.1.1 collected by the data collection part 2.6 is lower than a standard value, the working medium conveying part is used for supplementing the working medium into the tube body 1.1.

The electric energy measuring part 2.7 is a voltage transmitter and a current transmitter. By connecting the electric energy measuring part 2.7 with the evaporation interval 1.1.1 and the thermal insulation interval 1.1.2 respectively, the output electric energy generated by the movement of the working medium under the heat conduction is obtained, and it is connected with the data collecting part 2.6 to realize the collection and summary of the output electric energy.

In addition, the working medium conveying part is a common pump, conveying pipe, etc. By opening a through hole in the side wall surface of the tube body 1.1 and combining the liquid level signals of the working medium in the evaporation interval 1.1.1 with the liquid level gauge 2.5, it is judged whether it is necessary to supplement the working medium in the tube body 1.1, so that there is enough working medium in the evaporation interval 1.1.1 to ensure the detection efficiency of the testing system.

Further, the first measuring part includes:
- at least one fiber grating sensor 2.1 arranged in the tube body 1.1 along a length direction of the tube body 1.1 and used for obtaining temperature signals and pressure signals of the working medium in the testing process, and one end of the fiber grating sensor 2.1 is in communication connection with the data collection part 2.6 through a fiber demodulator 2.1.1;

Further, the second measuring part includes:
- at least two flow velocity sensors 2.2 respectively arranged at joints of the thermal insulation interval 1.1.2, the evaporation interval 1.1.1 and the condensation interval 1.1.3 and used for obtaining flow velocity signals of the inner cavity of the tube body 1.1 in the each interval part; and
- at least two pressure transmitters 2.3, respectively arranged at the joints of the thermal insulation interval 1.1.2, the evaporation interval 1.1.1 and the condensation interval 1.1.3, and are used for obtaining the pressure signals of the inner cavity of the tube body 1.1 in the each interval part;
- where, the flow velocity sensors 2.2 and the pressure transmitters 2.3 are respectively in communication connection with the data collection part 2.6.

The flow velocity sensors 2.2 and the pressure transmitters 2.3 are used together, and at least two groups are provided, so as to monitor the parameter signal in the inner cavity of the tube body 1.1, and the parameter information is detected and recorded through the test system, which enhances the substantive role of promoting the development of geothermal power generation technology in the future.

By using the through hole opened in the side wall surface of the tube body 1.1, the flow velocity sensors 2.2 and the pressure transmitters 2.3 may be directly arranged at the through hole while supplementing the working medium, so that the detection ends of the two may be easily extended into the tube body 1.1 for detection, the structural integrity is improved, and the efficiency and diversity of test data collection are ensured.

Further, the temperature measuring part includes:
a plurality of surface thermocouples 2.4 uniformly distributed on the surface of the tube body 1.1 along the length direction of the tube body 1.1 for obtaining temperature signals of the surface of the tube body 1.1, and the plurality of the surface thermocouples 2.4 are in communication connection with the data collection part 2.6 through a multi-channel PID temperature controller 2.4.1.

The surface temperature of the tube body 1.1 is detected by several surface thermocouples 2.4 attached to the outer wall of the tube body 1.1, and the temperature change when the working medium forms are cyclically switched is obtained in real time.

Further, the system further includes:
a thermoelectric module 1.2 arranged on the evaporation interval 1.1.1 and configured to generate output electric energy when the action of the heat conduction is existed outside; and
a plurality of generators 1.3 arranged on the thermal insulation interval 1.1.2, where the generators 1.3 are provided with a power generation end, and when the working medium passes through the thermal insulation interval 1.1.2 in a gas state, the power generation end moves to generate the output electric energy, where the thermoelectric module 1.2 and the generators 1.3 are in communication connection with the data collection part 2.6.

By arranging the thermoelectric module 1.2 corresponding to the outer wall surface of the evaporation interval 1.1.1, the working medium in the evaporation interval 1.1.1 is converted into the gas state and moves along the thermal insulation interval 1.1.2 under the action of heat conduction, and the heat conduction acting on the evaporation interval 1.1.1 may be exchanged by using the thermoelectric module 1.2, thus improving the power generation efficiency of the tube 1.1. Moreover, the thermoelectric module 1.2 and the generators 1.3 are monitored in real time through the voltage transmitter and current transmitter of the electric energy measuring part 2.7, and are in communication connection with the data collection part 2.6 (i.e. the computer), so as to realize the experimental detection of multiple groups of output electric energy parameters and further improve the detection effect of the testing system and the diversity of data.

The generators 1.3 adopt the common magnetic suspension turbine generator, and the gas working medium passes through the generator blades, and the blades rotate to generate the movement of cutting the magnetic induction line, so as to realize power generation.

Moreover, in one embodiment of the present disclosure, each output structure of the generators 1.3 and the thermoelectric module 1.2 is connected to the connection terminal, which is convenient to adjust the series-parallel connection mode.

Further, the system further includes:
a heat source 1.4, where a heating end of the heat source 1.4 is connected with the evaporation interval 1.1.1, so that the working medium is always switched from the liquid state to the gas state, where the working medium in the gas state moves along the direction from the evaporation interval 1.1.1 to the condensation interval 1.1.3; and
a refrigerant 1.5 arranged in the condensation interval 1.1.3 and configured to absorb heat of the working medium in the gas state, so as to switch the working medium from the gas state to the liquid state.

Further, the heat source 1.4 includes:
a plurality of electric heating plates coated on an outer wall surface of the evaporation interval 1.1.1, and one end of each of the electric heating plates is connected with a controller, and the electric heating plates have an adjustable heating temperature through the controller.

In this technical scheme, the electric heating plates are used to simulate the actual heat conduction, and by providing heat conduction to the evaporation interval 1.1.1 of the tube body 1.1, the switching of working medium forms is ensured, and the circulating operation is carried out to generate electricity. Correspondingly, the controller is a silicon controlled voltage regulator module, which is connected with the multi-channel PID temperature controller 2.4.1, so that the voltage may be easily adjusted according to the difference between the detected temperature in the pipeline and the temperature of the electric heating plate, and the power generation test under various actual working conditions is realized.

According to the actual needs, the combination of electric heating sheet and electric heating tube may also be used to realize the heat conduction of the heat source 1.4 to the tube body 1.1.

Further, the refrigerant 1.5 includes:
a water-cooled condenser 1.5.1, where an outer wall of the condensation interval 1.1.3 is coated with a plurality of heat exchange fins 1.5.3, and one end of the water-cooled condenser 1.5.1 is connected with the heat exchange fins 1.5.3 through a pipeline to absorb the heat of the working medium in the gas state; and
an armored thermocouple 1.5.2 arranged on a pipeline of the water-cooled condenser 1.5.1, and is in communication connection with the data collection part 2.6.

The heat exchange fins 1.5.3 are wrapped outside the condensation interval 1.1.3, so that the heat in the working medium which absorbs the heat conducted by the electric heater may be absorbed, and the heat exchange may be realized through the pipeline connected with the heat exchange fins 1.5.3 through the water-cooled condenser, so that the temperature of the working medium may be reduced and the geothermal energy may be fully utilized under actual working conditions.

By connecting the armored thermocouple 1.5.2 to the water-cooled condenser 1.5.1, the monitoring of heat exchange water temperature is realized, and the armored thermocouple 1.5.2 is in communication connection with the data collection part 2.6, so as to improve the diversity of test system parameters.

Further, a cross section of the tube body 1.1 corresponding to the evaporation interval 1.1.1 is a polygonized structure.

Since both sides of the thermoelectric module 1.2 are filled with thermal interface materials such as thermal conductive silicone grease, silica gel sheet, liquid metal, phase change sheet, etc. (not shown in the figures), the thermal conductivity is improved. Therefore, the part of the tube body 1.1 corresponding to the evaporation interval 1.1.1 adopts the structure with polygonal cross section, preferably but not limited to hexagon, octagon, etc., so as to improve the contact with the thermal interface materials, the thermoelectric module 1.2 and the electric heating sheet, and improve the testing effect.

In the description of the present disclosure, it should be understood that the orientation or positional relationships indicated by the terms "longitudinal", "transverse", "upper", "lower", "front", "rear", "left", "right", "vertical", "horizontal", "top", "bottom", "inner", "outer" are based on the orientation or positional relationship shown in the drawings are only for the convenience of describing the disclosure, rather than indicating or implying that the device or element referred to must have a specific orientation, be constructed and operated in a specific orientation, and therefore cannot be understood as a limitation to the disclosure.

The above-mentioned embodiments only describe the preferred mode of the disclosure, and do not limit the scope of the disclosure. Under the premise of not departing from the design spirit of the disclosure, various modifications and improvements made by ordinary technicians in the field to the technical scheme of the disclosure shall fall within the protection scope determined by the claims of the disclosure.

What is claimed is:

1. A multi-parameter integrated test system for deep geothermal in-situ power generation, comprising:
   a tube body, wherein an inner cavity is movably matched with a working medium, and an evaporation interval, a thermal insulation interval and a condensation interval are respectively defined on the tube body, wherein under an action of heat conduction, the working medium moves along a direction from the evaporation interval to the condensation interval, and a form of the working medium is switched in an order of liquid-gas-liquid; the evaporation interval and the thermal insulation interval output electric energy outwards, and the working medium always moves towards the evaporation interval in a liquid state;
   a testing mechanism, comprising:
      a first measuring part arranged in the tube body to obtain parameter signals of the working medium in a testing process;
      a second measuring part arranged in the evaporation interval, the thermal insulation interval and the condensation interval to obtain parameter signals of the inner cavity of the tube body in each interval part;
      a temperature measuring part arranged on a surface of the tube body to obtain temperature signals of the tube body in the testing process;
      a liquid level gauge communicated with a part of the tube body located in the evaporation interval to obtain liquid level signals of the working medium in the evaporation interval; and
      a data collection part respectively in communication connection with the first measuring part, the second measuring part, the temperature measuring part and the liquid level gauge, so as to respectively collect the parameter signals of the working medium, the parameter signals of the inner cavity of the tube body in the each interval part, the temperature signals of the tube body and the liquid level signals of the working medium in the evaporation interval;
   further comprising: an electric energy measuring part, arranged in the thermal insulation interval and the evaporation interval and used for obtaining output electric energy parameters and is in communication connection with the data collection part;
   a working medium conveying part, connected with the tube body and is in communication connection with the data collection part; when the liquid level signals of the working medium in the evaporation interval collected by the data collection part is lower than a standard value, the working medium conveying part is used for supplementing the working medium into the tube body;
   wherein the first measuring part comprises at least one fiber grating sensor arranged in the tube body along a length direction of the tube body and used for obtaining temperature signals and pressure signals of the working medium in the testing process, and one end of the fiber grating sensor is in communication connection with the data collection part through a fiber demodulator;
   the second measuring part comprises at least two flow velocity sensors respectively arranged at joints of the thermal insulation interval, the evaporation interval and the condensation interval and used for obtaining flow velocity signals of the inner cavity of the tube body in the each interval part; and
   at least two pressure transmitters, respectively arranged at the joints of the thermal insulation interval, the evaporation interval and the condensation interval, and are used for obtaining the pressure signals of the inner cavity of the tube body in the each interval part;
   wherein, the flow velocity sensors and the pressure transmitters are respectively in communication connection with the data collection part.

2. The multi-parameter integrated test system for the deep geothermal in-situ power generation according to claim 1, wherein the temperature measuring part comprises:
   a plurality of surface thermocouples uniformly distributed on the surface of the tube body along the length direction of the tube body for obtaining temperature signals of the surface of the tube body, and the plurality of the surface thermocouples are in communication connection with the data collection part through a multi-channel PID temperature controller.

3. The multi-parameter integrated test system for the deep geothermal in-situ power generation according to claim 1, further comprising:
   a thermoelectric module arranged on the evaporation interval and configured to generate output electric energy when the action of the heat conduction is existed outside; and
   a plurality of generators arranged on the thermal insulation interval, wherein the generators are provided with a power generation end, and when the working medium passes through the thermal insulation interval in a gas state, the power generation end moves to generate the output electric energy, wherein the thermoelectric module and the generators are in communication connection with the data collection part.

4. The multi-parameter integrated test system for the deep geothermal in-situ power generation according to claim 1, further comprising:
   a heat source, wherein a heating end of the heat source is connected with the evaporation interval, so the working medium is always switched from the liquid state to a gas state, wherein the working medium in the gas state moves along the direction from the evaporation interval to the condensation interval; and
   a refrigerant arranged in the condensation interval and configured to absorb heat of the working medium in the gas state, so as to switch the working medium from the gas state to the liquid state.

5. The multi-parameter integrated test system for the deep geothermal in-situ power generation according to claim 4, wherein the heat source comprises:

a plurality of electric heating plates coated on an outer wall surface of the evaporation interval, and one end is connected with a controller, and the electric heating plates have an adjustable heating temperature through the controller.

6. The multi-parameter integrated test system for the deep geothermal in-situ power generation according to claim 4, wherein the refrigerant comprises:

a water-cooled condenser, wherein an outer wall of the condensation interval is coated with a plurality of heat exchange fins, and one end of the water-cooled condenser is connected with the heat exchange fins through a pipeline to absorb the heat of the working medium in the gas state; and an armored thermocouple arranged on a pipeline of the water-cooled condenser, and is in communication connection with the data collection part.

7. The multi-parameter integrated test system for the deep geothermal in-situ power generation according to claim 1, wherein a cross section of the tube body corresponding to the evaporation interval is a polygonized structure.

\* \* \* \* \*